(12) United States Patent
Waki

(10) Patent No.: US 10,118,229 B2
(45) Date of Patent: Nov. 6, 2018

(54) COATED TOOL

(71) Applicant: KYOCERA Corporation, Kyoto-shi, Kyoto (JP)

(72) Inventor: Masahiro Waki, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/305,917

(22) PCT Filed: Apr. 24, 2015

(86) PCT No.: PCT/JP2015/062605
§ 371 (c)(1),
(2) Date: Oct. 21, 2016

(87) PCT Pub. No.: WO2015/163470
PCT Pub. Date: Oct. 29, 2015

(65) Prior Publication Data
US 2017/0043406 A1    Feb. 16, 2017

(30) Foreign Application Priority Data

Apr. 24, 2014    (JP) .................. 2014-090684

(51) Int. Cl.
*B23B 27/14*    (2006.01)
*C23C 16/27*    (2006.01)
(Continued)

(52) U.S. Cl.
CPC .............. *B23B 27/14* (2013.01); *B23B 51/02* (2013.01); *C23C 16/26* (2013.01); *C23C 16/27* (2013.01);
(Continued)

(58) Field of Classification Search
CPC . B23B 27/14; B23B 2228/36; B23B 2228/10; B23B 2226/31; B23B 2228/105;
(Continued)

(56) References Cited

U.S. PATENT DOCUMENTS 5,232,318 A  *  8/1993  Santhanam ........... B23B 27/148
                                                            407/119
8,846,217 B2 *  9/2014  Waki .................... C23C 14/0641
                                                            407/119
(Continued)

FOREIGN PATENT DOCUMENTS

EP           1649955 A1      4/2006
JP      2000-128516 A        5/2000
(Continued)

OTHER PUBLICATIONS

English translation of JP 2007131893 A, dated May 2007.*
(Continued)

*Primary Examiner* — Alan Snyder
(74) *Attorney, Agent, or Firm* — Volpe and Koenig, P.C.

(57) ABSTRACT

In an embodiment, a coated tool is disclosed. The coated tool includes a base material, a first layer on the base material, and a second layer coated on the first layer. The first layer contains diamond crystals therein and has a first mean crystal size. The second layer contains diamond crystals therein and has a second mean crystal size that is smaller than the first mean crystal size. The first and the second layers contain hydrogen, and have a first hydrogen content and a second hydrogen content respectively. The second hydrogen content is larger than the first hydrogen content.

9 Claims, 4 Drawing Sheets

(51) Int. Cl.
  *B23B 51/02* (2006.01)
  *C23C 16/26* (2006.01)
  *C23C 28/04* (2006.01)

(52) U.S. Cl.
  CPC .......... *C23C 16/271* (2013.01); *C23C 28/044* (2013.01); *C23C 28/046* (2013.01); *C23C 28/048* (2013.01); *B23B 2226/31* (2013.01); *B23B 2228/04* (2013.01); *B23B 2228/105* (2013.01); *B23B 2228/44* (2013.01)

(58) Field of Classification Search
  CPC . B23B 2228/44; C23C 25/044; C23C 28/046; C23C 28/048
  See application file for complete search history.

(56) References Cited

U.S. PATENT DOCUMENTS

| | | | |
|---|---|---|---|
| 2006/0115650 A1* | 6/2006 | Hanyu | B23B 51/02 428/408 |
| 2006/0216515 A1 | 9/2006 | Kazahaya et al. | |

FOREIGN PATENT DOCUMENTS

| | | | |
|---|---|---|---|
| JP | 2002-322555 A | 11/2002 | |
| JP | 2003-026414 A | 1/2003 | |
| JP | 2007131893 A * | 5/2007 | ............... B23C 5/10 |
| JP | 2008-001951 A | 1/2008 | |
| JP | 2012-086317 A | 5/2012 | |
| JP | 2012-115928 A | 6/2012 | |
| JP | 2012-176471 A | 9/2012 | |
| WO | 2005/011902 A1 | 2/2005 | |

OTHER PUBLICATIONS

English translation of JP2012-176471, dated Sep. 2012.*
English translation of JP2012-086317, dated May 2012.*
International Search Report, PCT/JP2015/062605, dated Jul. 28, 2015, 2 pgs.
Extended European Search Report, European Patent Application No. 15782485.5, dated Nov. 20, 2017, 9 pgs.
Vojs, M., et al., "Double bias HF CVD multilayer diamond films on WC-Co cutting tools," Science Direct, Diamond & Related Materials 14 (2005), pp. 613-616.

* cited by examiner

COATED TOOL

TECHNICAL FIELD

The present invention relates to a coated tool having a diamond layer on a surface of a base material.

BACKGROUND ART

Coated tools, such as cutting tools, have been known in which a diamond layer composed of diamond is deposited on a surface of a base material. Although high hardness of the diamond layer has improved wear resistance, a state in which diamond particles protrude beyond a surface of the diamond layer has occurred in some cases along with grain growth of the diamond particles. On this occasion, ingredients of a work material have been caught in the diamond particles protruding beyond the surface of the diamond layer during a cutting process, and cutting resistance has increased. Consequently, peeling-off of the diamond layer and chipping have occurred.

For example, Patent Document 1 discloses a cutting tool in which a crystalline diamond layer and a nanodiamond layer having a mean particle size of 1-50 nm are sequentially deposited onto a surface of a base material made of cemented carbide.

RELATED ART DOCUMENT

Patent Document

Patent Document 1: Japanese Patent Unexamined Patent Publication No. 2012-176471

SUMMARY OF THE INVENTION

Problems to be Solved by the Invention

However, when a cutting process of a difficult-to-cut material, such as CFRP, as a work material is carried out with the cutting tool coated with the diamond layer in Patent Document 1, chipping and peeling-off of the diamond layer may occur. Hence, there is a demand for improvement of fracture resistance, and there is also a demand for improvement of wear resistance.

The present invention aims at providing a coated tool, such as a cutting tool, which is capable of inhibiting occurrence of chipping, peeling-off, or the like of a diamond layer by enhancing fracture resistance, and which has the diamond layer with enhanced wear resistance.

Means for Solving the Problems

The coated tool of the present embodiment includes a base material and a diamond layer coated on a surface of the base material. The diamond layer has a first coating layer located close to the base material, and a second coating layer located on the first coating layer. A mean particle size of second diamond particles constituting the second coating layer is smaller than a mean particle size of first diamond particles constituting the first coating layer. The diamond layer contains hydrogen, and a hydrogen content in the second coating layer is larger than a hydrogen content in the first coating layer.

Effects of the Invention

With the coated tool of the present embodiment, it is possible to provide the coated tool having the diamond layer with high fracture resistance and high wear resistance.

EMBODIMENTS FOR CARRYING OUT THE INVENTION

Figure 1:
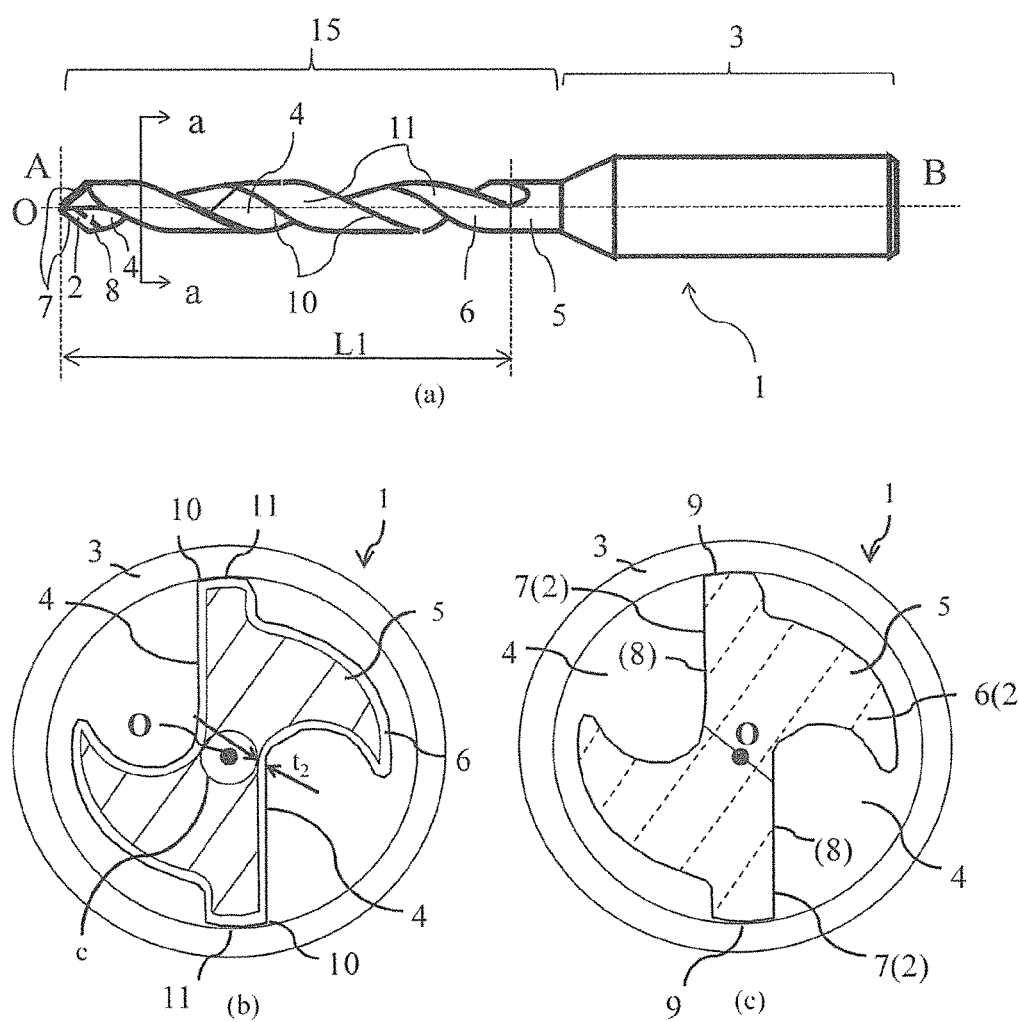
FIG. 1(a) is a side view that shows an example of a drill being a cutting tool, as an example of a coated tool of the present embodiment.
FIG. 1(b) is a sectional view taken along line a-a in FIG. 1(a)
FIG. 1(c) is a view taken from a front end of the drill.

As an example of the cutting tool that is a preferred example of the coated tool of the present embodiment, a solid-type drill is described with reference to the drawings. As shown in FIG. 1, the drill 1 has a rod-shaped base material 5 having a rotation axis O, a cutting edge 2 formed at a front end A, and a chip discharge groove 4 formed along the cutting edge 2 on a rotation direction side of the cutting edge 2 and formed spirally rearward. A shank part 3 is located on a rear end side of a cutting edge part 15 including the cutting edge 2 and the chip discharge groove 4. The shank part 3 is held by a machining apparatus (not shown) and the drill 1 is attached to the machining apparatus.

The base material 5 is composed of a hard alloy containing a hard phase and a binding phase. Examples of the hard alloy include cemented carbide whose binding phase is composed of an iron group metal and whose hard phase is composed of tungsten carbide, and cermet whose hard phase is composed of titanium carbonitride. According to the present embodiment, a content of the binding phase is 5-15% by mass, particularly 6-10% by mass.

A surface of the base material 5 in the cutting edge part 15 is coated with a diamond layer 6. The entirety of the base material 5 including the shank part 3 may be coated with the diamond layer 6. The diamond layer 6 in the cutting edge 2 contains diamond particles, and in some cases, contains the diamond particles and a graphite phase.

Figure 2:
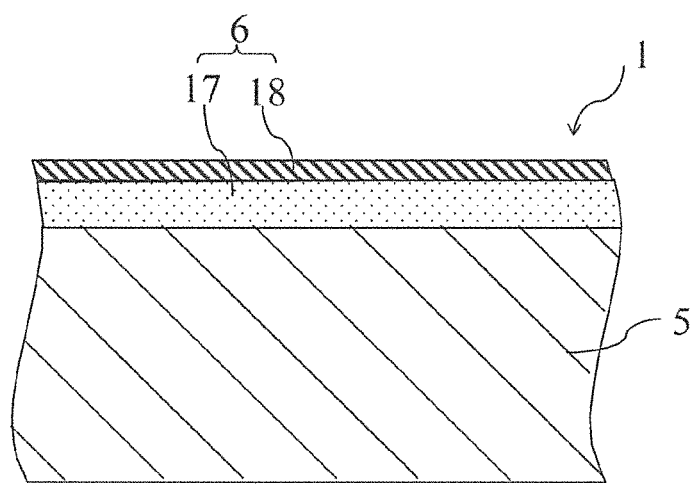
FIG. 2 is a cross-sectional schematic diagram that describes a configuration of a diamond layer in the drill of FIG. 1.

According to the present embodiment, as shown in FIG. 2, the diamond layer 6 has a first coating layer 17 located close to the base material 5, and a second coating layer 18 located on the first coating layer 17. A mean particle size of second diamond particles constituting the second coating layer 18 is smaller than a mean particle size of first diamond particles constituting the first coating layer 17. The diamond layer 6 contains hydrogen. A hydrogen content in the second coating layer 18 is larger than a hydrogen content in the first coating layer 17.

The first coating layer 17 has the larger mean particle size of the diamond particles and the lower hydrogen content, and therefore has high hardness, thereby improving wear resistance of the diamond layer 6. The second coating layer 18 has the smaller mean particle size of the diamond particles and the higher hydrogen content than the first coating layer 17 and therefore has low hardness and low affinity for ingredients of a workpiece. This improves slidability of the ingredients of the workpiece, such as a work material, thereby reducing cutting resistance. Additionally, because of the larger mean particle size of the diamond particles of the first coating layer 17, the first coating layer 17 has irregularities on the surface thereof, and an interface between the irregularities and the first coating layer 17 acts as anchor effect, thereby making it possible to inhibit peeling-off of the second coating layer 18. Accordingly, the diamond layer 6 has excellent fracture resistance. The surface of the second coating layer 18 is smooth and has high slidability and high welding resistance, thereby also improving the wear resistance of the diamond layer 6. A mean particle size of diamond crystals in the diamond layer 6 can be calculated with a Luzex image analysis method by observing structures from the surface of the diamond layer 6 by way of color mapping for checking orientation of the diamond particles with a scanning electron microscope (SEM), a transmission electron microscope (TEM), or electron backscatter diffraction (EBSD) method. The hydrogen content in each of the first coating layer 17 and the second coating layer 18 can be measured by a secondary ion mass spectrometry (SIMS). The hydrogen content in the first coating layer 17 is also measurable after removing the second coating layer 18 by polishing or the like.

In the present embodiment, the first diamond particles in the first coating layer 17 has a mean particle size of 0.1-3 µm, and the second diamond particles in the second coating layer 18 has a mean particle size of 0.001-0.09 µm. Accordingly, the first diamond particles have high hardness, and the first coating layer 17 has high hardness, thereby enhancing the wear resistance of the diamond layer 6. Furthermore, the surface of the first coating layer 17, namely, the interface between the first coating layer 17 and the second coating layer 18 does not become too rough, thus leading to a smooth surface of the diamond layer 6. The second diamond particles have the small mean particle size, and the second coating layer 18 has a smooth surface, thereby preventing the surface of the diamond layer 6 from becoming excessively rough. Therefore, breakage of the drill 1 can be inhibited by reducing the cutting resistance of the diamond layer 6 in the cutting edge 2. It is consequently possible to optimize the wear resistance and fracture resistance of the diamond layer 6.

In the present embodiment, the hydrogen content in the second coating layer 18 is larger than the hydrogen content in the first coating layer 17. Specifically, the hydrogen content in the first coating layer 17 is 0.2-3.0% by atom, and the hydrogen content in the second coating layer 18 is 1-20% by atom. This enhances the hardness of the first coating layer 17, thereby enhancing the wear resistance of the diamond layer 6. Additionally, because the second coating layer 18 has the lower hardness than the first coating layer 17, the surface of the second coating layer 18 is smooth by being smoothened at an early stage in the process. This contributes to reducing the cutting resistance of the diamond layer 6 in the cutting edge 2, thereby inhibiting the breakage of the drill 1. It is consequently possible to optimize the wear resistance and fracture resistance of the diamond layer 6.

The first coating layer 17 has a thickness of 5-15 µm, and the second coating layer 18 has a thickness of 0.5-3 µm. This contributes to enhancing the wear resistance and fracture resistance of the diamond layer 6. The thickness of each of the first coating layer 17 and the second coating layer 18 is basically confirmable by observing a cross section of the diamond layer 6 through a microscope. When in the observation through the microscope, it is difficult to determine the interface between the first coating layer 17 and the second coating layer 18, a contour of each particle is confirmed by displaying, by way of color mapping, the orientation of the first diamond particles in a cross section by the electron backscatter diffraction (EBSD). On this occasion, the boundary between the first coating layer 17 and the second coating layer 18 is confirmable because the second diamond particles have the smaller mean particle size than the first diamond particles. Even when the particle size of the second diamond particles is smaller than optical resolution of an EBSD analysis apparatus, the second diamond particles are observable as achromatic color. Therefore, the boundary between a color region of the first coating layer 17 and an achromatic color region of the second coating layer 18 can be determined as the interface between the first coating layer 17 and the second coating layer 18.

When roughness of the interface between the first coating layer 17 and the second coating layer 18 is larger than roughness of the surface of the second coating layer, the surface of the diamond layer 6 becomes smooth and thereby reduces cutting resistance, and adhesion between the first coating layer 17 and the second coating layer 18 is also enhanced to improve the wear resistance of the diamond layer 6.

In the present embodiment, the diamond layer 6 has enhanced wear resistance when the roughness of the interface between the first coating layer 17 and the second coating layer 18 is 0.4-2 µm, and the roughness of the surface of the second coating layer 18 is 0.05-0.25 µm. In the present embodiment, the roughness of the interface between the first coating layer 17 and the second coating layer 18, and the roughness of the surface of the second coating layer are obtainable by tracing the interface between the first coating layer 17 and the second coating layer 18 from a cross-sectional observation including the interface between the base material 5 and the diamond layer 6, and then calculating an arithmetic mean roughness Ry from a locus thereof according to ISO4287 (JISB0601). The result is employable as interface roughness. When the interface between the first coating layer 17 and the second coating layer 18 is clear from an SEM photograph in the cross-sectional observation, it is possible to determine the interface from the SEM photograph. When the interface between the first coating layer 17 and the second coating layer 18 is not clear from the SEM photograph, the interface between the first coating layer 17 and the second coating layer 18 is confirmed by displaying the orientation of the first diamond particles by way of color mapping by the foregoing electron backscatter diffraction (EBSD) method, and then confirming the contour of each particle. The roughness of the interface between the first coating layer 17 and the second coating layer 18, and the roughness of the surface of the second coating layer are measured at a flat location of the coated tool, and are measured at the chip discharge groove 4 in the drill 1 of FIG. 1. A preferable roughness range of the interface between the first coating layer 17 and the second coating layer 18 is 0.4-1.5 µm, and that of the surface of the second coating layer is 0.05-0.09 µm.

In the present embodiment, interface roughness in the surface of the base material 5 in the cutting edge 2 is 0.12-1.5 µm, and interface roughness in the surface of the base material 5 in the chip discharge groove 4 is 0.01-0.1 µm. This makes it possible to optimize adhesion of the diamond layer 6 in the cutting edge 2 and in the chip discharge groove 4. The interface roughness is measurable by tracing the interface between the base material 5 and the diamond layer 6 from an SEM observation of a cross section including the interface between the base material 5 and the diamond layer 6, and then calculating arithmetic mean roughness Rz from a locus thereof according to ISO4287 (JISB0601). The result is employable as interface roughness.

When the diamond layer 6 is measured using Raman spectroscopy method, a specific peak strength ratio of the second diamond particles in the second coating layer 18 is smaller than a specific peak strength ratio of the first diamond particles in the first coating layer 17. Specifically, by measuring peak strength of a diamond peak SP3 (SP3 strength) around 1333 $cm^{-1}$ and peak strength of a graphite peak SP2 (SP2 strength) in a range of 1400-1600 $cm^{-1}$ in the first coating layer 17 and the second coating layer 18, the specific peak strength ratio (SP3 ratio) of the diamond particles in each of the coating layers 17 and 18 can be calculated from SP3 strength/(SP3 strength+SP2 strength). A high SP3 ratio of the first coating layer 17 improves hardness of the first coating layer 17. In a Raman spectrum of the second coating layer 18, a nanocrystal diamond peak is detectable around 1140 $cm^{-1}$ separately from the SP3 peak.

In the present embodiment, it is possible to enhance the wear resistance of the diamond layer 6 when residual stress at an intermediate position in the thickness of the first coating layer 17 is compressive stress, and residual stress at an intermediate position in the thickness of the second coating layer 18 is extension stress. The residual stress of each of the first coating layer 17 and the second coating layer 18 can be confirmed by checking a wavenumber of a peak top of the diamond peak SP3 in the Raman spectroscopy method. Specifically, a determination can be made that the coating layer is subjected to extension stress when the wavenumber of the peak top of the diamond peak SP3 is smaller than 1333 $cm^{-1}$, and that the coating layer is subjected to compressive stress when the wavenumber of the peak top of the diamond peak SP3 is larger than 1333 $cm^{-1}$. The intermediate position in the thickness of each layer is obtained as follows. A mean thickness of each layer is calculated on the basis of the foregoing boundary of each layer, and a position corresponding to a half of the thickness is employed as the intermediate position of the thickness of each layer.

With the present embodiment, in the cutting edge 2, a content ratio of the binding phase in a surface part of the base material 5 is less than 0.9 times a content ratio of the binding phase in the interior of the base material 5, and the surface of the cutting edge 2 is coated with the diamond layer 6. In the present embodiment, the content ratio of the binding phase in the surface part of the base material 5 in the cutting edge 2 is 0.1-0.3 times the content ratio of the binding phase in the interior of the base material 5. In the chip discharge groove 4, the content ratio of the binding phase in the surface part of the base material 5 is 0.9-1.1 times the content ratio of the binding phase in the interior of the base material 5, and the surface of the chip discharge groove 4 is coated with the diamond layer 6, or the surface of the base material 5 is exposed to the surface. Accordingly, the adhesion of the diamond layer 6 is enhanced in the cutting edge 2, thereby inhibiting progress of wear in the cutting edge 2. In the chip discharge groove 4, the diamond layer 6 is not deposited, or the diamond layer 6 has poor adhesion and the diamond layer 6 may peel off early. Hence, the surface of the chip discharge groove 4 becomes smooth to improve chip discharge performance.

In the present embodiment, the diamond layer 6 in the cutting edge 2 has the first coating layer 17 and the second coating layer 18 described above, thereby improving the wear resistance and fracture resistance of the diamond layer 6.

Further in the present embodiment, when the chip discharge groove 4 is coated with the diamond layer 6, the diamond layer 6 has the first coating layer 17 and the second coating layer 18 even in the chip discharge groove 4, and graphite exists in the diamond layer 6 to be coated onto the chip discharge groove 4. A large amount of graphite needs to exist in either one of the first coating layer 17 and the second coating layer 18 in the diamond layer 6 of the chip discharge groove 4. In the present embodiment, a large amount of graphite exists in both of the first coating layer 17 and the second coating layer 18. A diamond content ratio in the diamond and graphite existing in the diamond layer 6 is higher in the diamond layer 6 in the cutting edge 2 than in the diamond layer 6 in the chip discharge groove 4. The thickness of the diamond layer 6 is smaller in the diamond layer 6 in chip discharge groove 4 than in the diamond layer 6 in the cutting edge 2. This optimizes surface roughness of the diamond layer 6 in the cutting edge 2 and in the chip discharge groove 4 before a cutting process, thereby preventing excessive cutting resistance from being exerted even at an early stage of the cutting process. When the thickness of the first coating layer 17 in the chip discharge groove 4 is smaller than the thickness of the first coating layer 17 in the cutting edge 2, the surface of the chip discharge groove 4 becomes smooth and therefore inhibits excessive cutting resistance exerted at the early stage of the cutting process. The thickness of the second coating layer 18 in the chip discharge groove 4 may be the same as the thickness of the first coating layer 17 in the cutting edge 2. The thickness of the second coating layer 18 in the chip discharge groove 4 may be smaller than the thickness of the first coating layer 17 in the cutting edge 2.

The thickness of the diamond layer 6 in the cutting edge 2 indicates a thickness of the diamond layer 6 at the front end of the drill 1 (the position of the rotation axis O). When the chip discharge groove 4 is coated with the diamond layer 6, the thickness of the diamond layer 6 in the chip discharge groove 4 indicates a thickness of the diamond layer 6 at a deepest part in the chip discharge groove 4 in a transverse section perpendicular to the rotation axis O at an intermediate position of a cutting edge length L1. The deepest part in the chip discharge groove 4 indicates a position at the shortest distance from the rotation axis O in the surface of the base material 1. A circle around the rotation axis O which passes through the position at the shortest distance, namely, a diameter of a maximum circle "c" that can be drawn in the drill 1 (a circle "c" shown in FIG. 1(b)) is a core thickness.

With the present embodiment, a ratio ($t_g/t_e$) of a thickness $t_e$ (not shown) of the diamond layer 6 in the cutting edge 2 and a thickness $t_g$ (not shown) of the diamond layer 6 in the chip discharge groove 4 is 0.2-0.9. This makes it possible to prevent the diamond layer 6 from being worn out in the cutting edge 2, and also retain smoothness of the diamond layer 6 in the chip discharge groove 4.

With the present embodiment, when the chip discharge groove 4 is coated with the diamond layer 6 (the first coating layer 17 and the second coating layer 18), a mean particle size of the second diamond particles in the second coating layer 18 in the chip discharge groove 4 is smaller than a mean particle size of the second diamond particles in the second coating layer 18 in the cutting edge 2. In the present embodiment, a preferable range of the mean particle size of the second diamond particles in the second coating layer 18 in the cutting edge 2 is 0.010-0.050 μm, and a preferable range of the mean particle size of the second diamond particles in the second coating layer 18 in chip discharge groove 4 is 0.008-0.035 μm. Consequently, the second coating layer 18 on the rear side and surface of the diamond layer 6 become smoother to improve chip discharge performance in the chip discharge groove 4 even at the early stage of the cutting process.

In FIG. 1(c), through the rake surface 8 is invisible, the position of the rake surface 8 is indicated in parentheses. The cutting edge 2 in the present invention includes a range of the entirety of a flank surface 9 (a hatched region indicated by broken lines), which is visible from the front end in FIG. 1(c), and also indicates a range of a width of 100 μm which includes a ridge line 7 located at the front end of the base material 5 and extends from the ridge line 7 toward the rake surface 8 (up to 100 μm rearward from the ridge line 7 at the front end) when viewed from a side surface in FIG. 1(a). In a triangular part close to the front end of the drill 1 when viewed from the side surface of FIG. 1(a), the cutting edge 2 is located at the front end and the rake surface 8 is located behind the cutting edge 2. The chip discharge groove 4 corresponds to a concave-shaped groove located rearward from a terminal end of the rake surface 8. In other words, the chip discharge groove 4 being connected to the rake surface 8, a side ridge line part 10 being connected to the ridge line 7 of the cutting edge 2, and a land part 11 being connected to the flank surface 9 are located behind the cutting edge 2 of the base material 5. The interior of the base material 5 in the present invention indicates a region close to the rotation axis O, whose depth from the surface of the base material 5 is 5 μm or more. The content ratio of the binding phase indicates a ratio of the content of the binding phase with respect to the content of a total of metals in the hard alloy.

The diamond layer 6 extends from the front end A of the drill 1 to the vicinity of a terminal end provided with the chip discharge groove 4, and the base material 5 is exposed in a region extending behind the terminal end. Alternatively, the surface of the second coating layer 18 of the diamond layer 6 in the cutting edge 2 may be smoothened by subjecting the front end side of the drill 1 to a polishing process, such as a brushing process and a blasting process. In this case, the surface of the chip discharge groove 4 has poor adhesion even through the diamond layer 6 is deposited thereon, and therefore, the diamond layer 6 may peel off to expose the base material 5. On this occasion, because the surface of the chip discharge groove 4 is located at a position at which the surface of the chip discharge groove 4 is less apt to be polished, the surface of the chip discharge groove 4 is not excessively subjected to the polishing process, and therefore, the smoothness on the surface of the base material 5 of the chip discharge groove 4 is less apt to be impaired. Still alternatively, the surface roughness of the base material 5 in the cutting edge 2 may be controlled by subjecting the front end side of the base material before the diamond layer 6 is deposited thereon, to the polishing process, such as the brushing process and the blasting process.

Another coating layer (not shown) may be laminated between the diamond layer 6 and the base material 5. The coated tool of the present embodiment is not limited to the drill of the foregoing embodiment, and is applicable to general cutting tools and particularly suitable for attachable and detachable cutting inserts. Among others, an end mill, reamer, and router is preferable which includes a rod-shaped tool body having an end cutting edge at a front end thereof and a peripheral cutting edge on a peripheral front end side thereof, and which has a chip discharge groove being adjacent to the end cutting edge and the peripheral cutting edge and extending rearward from the front end. In this case, the peripheral cutting edge preferably has the configuration of the cutting edge described above, in a range of 50 μm or less which extends from the ridge line toward the rake surface. Besides these, the coated tool is applicable to sliding members and wear resistant materials.

(Manufacturing Method)

A method for manufacturing the coated tool having the diamond layer is described below.

Figure 3:
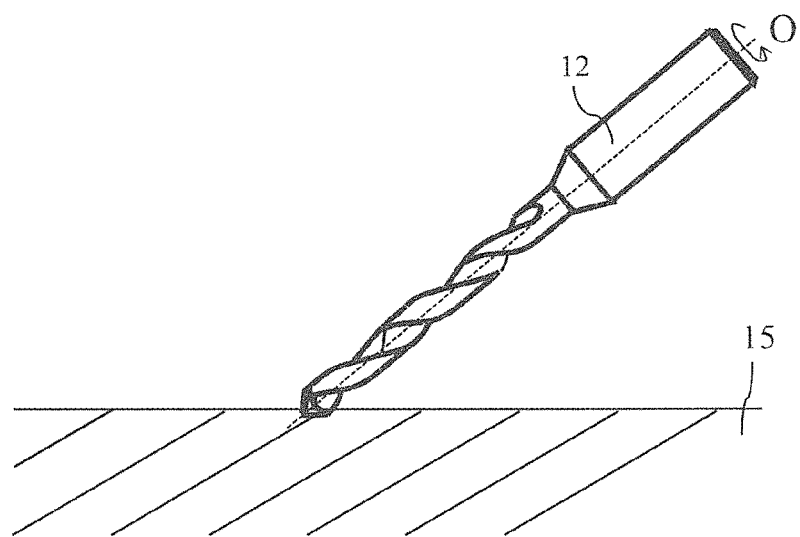
FIG. 3 is a schematic diagram that describes an etching process of a base material in manufacturing processes for the drill of FIG. 1.

Firstly, a base material is prepared. For example, when the coated tool is a drill, a surface of a cylindrical hard alloy is subjected to a centerless process and then a sharpening process, thereby manufacturing a drill-shaped base material. If desired, a cutting edge side of the base material is subjected to a polishing process. Subsequently, the surface of the base material is subjected to an etching process including acid treatment and alkali treatment. In the present embodiment, as shown in FIG. 3, only a predetermined part of the base material 5 is immersed in an acid solution 8 so that only the cutting edge 2 is mainly immersed in the acid solution 15 during the etching process, particularly during the acid treatment, and etching is carried out while causing rotation with a longitudinal direction of the base material 5 as a rotation axis. This makes it possible to control the content ratio of the binding phase in the surface of the base material. On this occasion, the content ratio of the binding phase in the cutting edge is controllable by controlling a concentration of the acid solution 15 and immersion time. The etched base material is washed with water or the like, and then dried.

Figure 4:
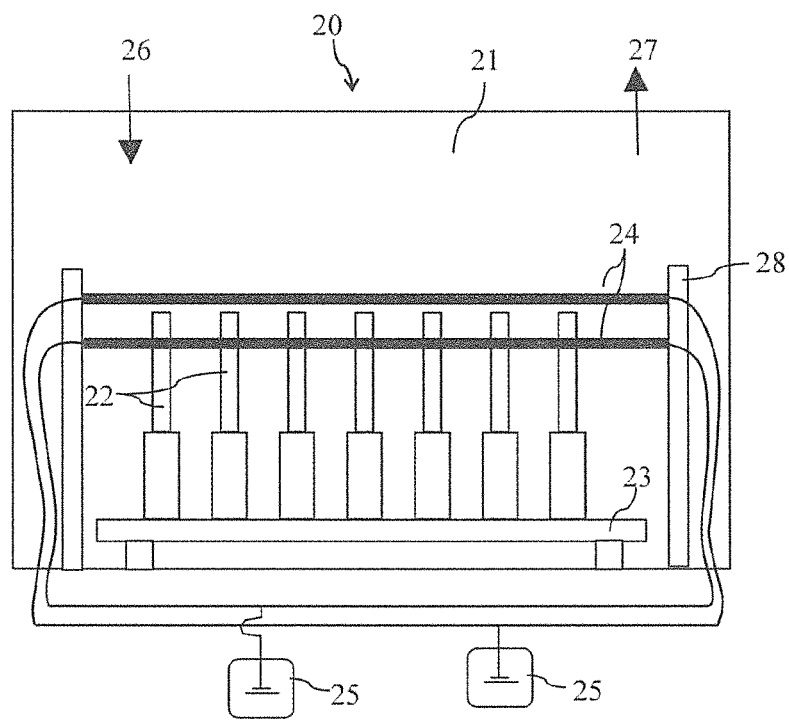
FIG. 4 is a schematic diagram that describes a deposition process of the diamond layer in the manufacturing processes for the drill of FIG. 1.

Thereafter, a diamond layer is deposited. As a method for depositing the diamond layer, a CVD method using a thermal filament method is suitably usable. An example of the deposition method is described in detail below. As shown in FIG. 4, a deposition apparatus 20 includes a chamber 21, and a sample stand 23 configured to mount samples (base bodies) 22 thereon is disposed in the chamber 21. With the present embodiment, the rod-shaped base body 22 is mounted vertically so that the front end thereof faces upward. A sharpening part (a part including the cutting edge and the chip discharge groove) of the base body 22 is omitted from FIG. 4.

A heater 24, such as a filament, is disposed around the base body 22. The heater 24 is connected to a power source 25 disposed outside the chamber 21. With the present embodiment, temperatures of the rod-shaped base bodies 22 mounted on the sample stand 23 are preferably controlled so as to be changed in the longitudinal direction of the base bodies 22 by using a plurality of heaters 24 while adjusting their arrangement and a current value supplied to each of the heaters 24. Specifically, control is performed so that the front end of each of the base bodies 22 has the highest temperature and the temperature gradually lowers on a rear end side of the base body 22. The heaters 24 are supported by a support 28.

The chamber 21 is provided with a raw material gas supply port 26 and a gas exhaust port 27. The diamond layer 6 can be deposited by supplying hydrogen gas and methane gas from the raw material gas supply port 26 into the chamber 21 in a vacuum state, and then spraying the hydrogen gas and the methane gas onto the base body 22.

In the present embodiment, a degree of vacuum is enhanced so that a degree of vacuum during deposition of the second coating layer is 0.5-2 kPa relative to a degree of vacuum of 3-5 kPa during deposition of the first coating layer, until a deposition temperature of the first coating layer and a deposition temperature of the second coating layer are the same. Further, control is performed so that a mixing ratio (% by volume) of methane during the deposition of the second coating layer is higher than a mixing ratio of methane during the deposition of the first coating layer. This achieves a configuration that the mean particle size of the second diamond particles constituting the second coating layer 8 is smaller than the mean particle size of the first diamond particles constituting the first coating layer 17, and the hydrogen content ratio in the second coating layer is larger than the hydrogen content ratio in the first coating layer.

Examples 7.0% by mass of metal cobalt (Co) powder, 0.8% by mass of chromium carbide ($Cr_3C_2$) powder, and the residual that was tungsten carbide (WC) powder having a mean particle size of 0.5 μm were added and mixed together. The mixture was molded into a cylindrical shape and sintered. This was subjected to a centering process and a sharpening process, thereby manufacturing a base material having a drill shape (a drill diameter of 6 mm, a core thickness of 3 mm, a cutting edge length of 10 mm, and a two-flute drill).

Thereafter, the base material was subjected to an etching process by sequentially immersing the base material in a depth of 0.5 mm in an acid solution (for 15 minutes in hydrochloric acid having a concentration presented in Table 1) and an alkali solution (for 5-30 seconds in Murakami Reagent) by a method of rotating the base material in a state in which a rotation axis of the base material was inclined 30° with respect to a liquid surface of the acid solution and the alkali solution as shown in FIG. 3. Subsequently, a drill base material was manufactured by washing the surface with distilled water. In Sample No. 5, the base material was immersed in a depth of 1 mm so that the rotation axis of the base material was perpendicular to the liquid surface of the acid solution and the alkali solution.

The base material was put into the deposition apparatus shown in FIG. 4, and a diamond layer was deposited on a surface of the base material by a thermal filament CVD method. The deposition apparatus is provided with a total of three tungsten filaments with a thickness of 0.4 mmϕ. Specifically, one tungsten filament is disposed on a front end side of the base material, and two tungsten filaments are disposed on side surfaces so as to sandwich the base material therebetween, in a reaction chamber with a diameter of 25 cmϕ and a height of 20 cm. The drill-shaped base materials were mounted vertically so that the front end thereof faced upward. A temperature at the front end (cutting edge) of the base material and a temperature at a position on the chip discharge groove which was located 3 mm behind the front end were respectively controlled to temperatures presented in Table 1 by controlling a current value supplied to the tungsten filaments. Subsequently, a diamond layer made up of the first coated layer and the second coating layer was deposited by loading a reaction gas composition composed of methane (% by volume presented in Table 1) and hydrogen (residual) from the supply port into the reaction chamber in a degree of vacuum presented in Table 1. In Samples Nos. 1 to 5, and 7, the first coating layer and the second coating layer were respectively deposited at temperatures presented in Table 1. In Sample No. 6, after the first coating layer was deposited at a temperature presented in Table 1, the second coating layer was deposited by setting a deposition temperature for the cutting edge to 820° C. and a deposition temperature for the chip discharge groove to 650° C.

In terms of the first coating layer and the second coating layer of the deposited diamond layer, crystal states respectively in the cutting edge and the chip discharge groove of the drill were measured by Raman spectroscopy, and an SP3 ratio (SP3 strength/(SP3 strength+SP2 strength)) was calculated from peak strength SP3 of a diamond peak SP3 around 1333 $cm^{-1}$ and peak strength of a graphite peak SP2 in 1400-1600 $cm^{-1}$. A ratio of a diamond content ratio in the chip discharge groove to a diamond content ratio in the cutting edge (indicated as P in the table) was also estimated. Further, the diamond layer deposited on the surface of the drill was subjected to an SEM observation, and a mean particle size of the diamond particles in the cutting edge was found with Luzex image analysis method. Hydrogen content ratios respectively in the first coating layer and the second coating layer were calculated by performing an SIMS analysis of the coating layer in a region including the cutting edge at the front end of the drill, and then measuring a distribution of the hydrogen content ratio from the surface of the diamond layer toward the base material. When variations occurred in the hydrogen content ratio in a depth direction of the diamond layer, a boundary between the first coating layer and the second coating layer was determined by collation with an SEM photograph, and a mean value was calculated in each of the first coating layer and the second coating layer.

A thicknesses of each of the first coating layer and the second coating layer was measured by carrying out an SEM observation of a cross section of the diamond layer at the front end (cutting edge) of the drill and at a position on the chip discharge groove which was located 3 mm behind the front end. The interface between the base material and the diamond layer (first coating layer) was traced from the SEM observation, and a maximum height Ry is calculated from a locus thereof according to JISB0601. The result was employed as interface roughness. From an EPMA analysis, a content ratio of the binding phase (Co) to a total of metal ingredients in cemented carbide was measured in each of the surface of the base material in the cutting edge at the front end of the drill (indicated by cutting edge "e" in Table), the surface of the base material in the chip discharge groove (at the position located 3 mm behind the front end of the drill (indicated by "chip discharge groove g" in Table), and a middle part of the base material (indicated by interior "i" in Table). The results were presented in Tables 1 to 3.

Cutting performance was evaluated by conducting a cutting test using the obtained drills under the following cutting conditions. The results were presented in Table 4.

Cutting method: drilling (through hole)

Work material: CFRP

Cutting speed (feed): 120 mm/min

Feed rate: 0.075 mm/cutting edge

Depth of cut: 8 mm in depth, ϕ6 mm in drilling diameter

Cutting state: under dry condition

Evaluation method: A wear width of the front end of the cutting edge (indicated as wear width in Table) and the number of drilled holes that caused burr were measured, and the state of the drill when it became impossible to drill (indicated as cutting state in Table) was checked after drilling 1000 holes (a termination point of drilling in the samples with which the number of drilled holes was less than 1000 before it became impossible to drill).

TABLE 1

| Sample No. | Acid treatment Method | Acid treatment Concentration (%) | Binding phase (% by mass) Interior i | Binding phase (% by mass) Chip Cutting edge e | Binding phase (% by mass) Chip discharge groove g | e/i | g/i | Temperature of base material (° C.) Cutting edge | Temperature of base material (° C.) Chip discharge groove | Degree of vacuum (kPa) First coating layer | Degree of vacuum (kPa) Second coating layer | CH4 (% by volume) First coating layer | CH4 (% by volume) Second coating layer |
|---|---|---|---|---|---|---|---|---|---|---|---|---|---|
| 1 | Declination | 3% | 7.0 | 2.0 | 6.9 | 0.29 | 0.99 | 860 | 700 | 3.8 | 1.0 | 2.8 | 5.8 |
| 2 | Declination | 10% | 7.0 | 1.0 | 6.7 | 0.14 | 0.96 | 820 | 650 | 3.6 | 1.5 | 2.6 | 6.3 |
| 3 | Declination | 6% | 7.0 | 1.6 | 6.8 | 0.23 | 0.97 | 900 | 760 | 4.0 | 1.0 | 3.0 | 6.0 |
| 4 | Declination | 12% | 7.0 | 0.8 | 6.6 | 0.11 | 0.94 | 860 | 700 | 4.5 | 0.8 | 3.5 | 5.7 |
| 5 | Front end | 10% | 7.0 | 0.9 | 6.3 | 0.13 | 0.90 | 860 | 700 | 4.2 | 1.1 | 3.2 | 6.2 |
| 6 | Declination | 10% | 7.0 | 0.9 | 6.3 | 0.13 | 0.90 | 860 | 700 | 4.1 | 4.0 | 3.0 | 4.8 |
| 7 | Declination | 10% | 7.0 | 0.9 | 6.3 | 0.13 | 0.90 | 870 | 700 | 4.0 | — | 3.0 | — |
| 8 | Declination | 6% | 7.0 | 1.6 | 6.8 | 0.23 | 0.97 | 900 | 760 | 4.0 | 1.0 | 3.0 | 3.0 |
| 9 | Entirety | 8% | 7.0 | 0.5 | 1.0 | 0.07 | 0.14 | 860 | 700 | 4.0 | 0.8 | 3.3 | 5.9 |
| 10 | Declination | 6% | 7.0 | 1.6 | 6.8 | 0.23 | 0.97 | 920 | 830 | 5.0 | 2.0 | 1.5 | 3.0 |

TABLE 2

| Sample No. | Interface roughness (μm) Cutting edge | Interface roughness (μm) Chip discharge groove | First coating layer SP3 ratio Cutting edge | First coating layer SP3 ratio Chip discharge groove | First coating layer P | First coating layer Mean particle size (μm) | First coating layer Hydrogen content ratio (% by atom) | First coating layer Interface roughness (μm) | First coating layer Residual stress (MPa) | First coating layer Thickness (μm) Cutting edge $t_e$ | First coating layer Thickness (μm) Chip discharge groove $t_g$ | $t_g/t_e$ |
|---|---|---|---|---|---|---|---|---|---|---|---|---|
| 1 | 0.2 | 0.011 | 90 | 70 | 0.78 | 1.8 | 2.3 | 0.44 | −520 | 8.2 | 5.6 | 0.68 |
| 2 | 0.94 | 0.014 | 80 | 64 | 0.80 | 0.22 | 2.5 | 1.21 | −410 | 7.1 | 4.9 | 0.69 |
| 3 | 0.31 | 0.008 | 92 | 75 | 0.82 | 1.2 | 1.0 | 0.91 | −300 | 8.9 | 7.0 | 0.79 |
| 4 | 1.41 | 0.13 | 90 | 70 | 0.78 | 1.8 | 2.8 | 0.24 | 240 | 11.2 | 9.6 | 0.86 |
| 5 | 1.12 | 0.84 | 85 | 70 | 0.82 | 1.8 | 1.2 | 0.56 | −550 | 8.7 | 5.9 | 0.68 |
| 6 | 1.12 | 0.84 | 80 | 65 | 0.81 | 1.8 | 1.8 | 1.11 | −800 | 8.2 | 5.6 | 0.68 |
| 7 | 1.12 | 0.84 | 90 | 70 | 0.78 | 1.8 | 1.9 | 1.24 | −400 | 10.2 | 8.5 | 0.83 |
| 8 | 0.31 | 0.008 | 92 | 75 | 0.82 | 1.2 | 1.0 | 0.91 | −200 | 8.9 | 7.0 | 0.79 |
| 9 | 1.31 | 1.31 | 90 | 82 | 0.91 | 0.08 | 1.2 | 0.71 | 120 | 6.2 | 4.7 | 0.76 |
| 10 | 0.31 | 0.008 | 89 | 80 | 0.90 | 3.1 | 0.8 | 2.1 | −900 | 16.0 | 10.9 | 0.68 |

TABLE 3

| Sample No. | Second coating layer SP3 ratio Cutting edge | Second coating layer SP3 ratio Chip discharge groove | Second coating layer P | Second coating layer Mean particle size (μm) Cutting edge | Second coating layer Mean particle size (μm) Chip discharge groove | Second coating layer Hydrogen content ratio (% by atom) | Second coating layer Surface roughness (μm) | Second coating layer Residual stress (MPa) | Second coating layer Thickness (μm) Cutting edge $t_e$ | Second coating layer Thickness (μm) Chip discharge groove $t_g$ | $t_g/t_e$ |
|---|---|---|---|---|---|---|---|---|---|---|---|
| 1 | 50 | 48 | 0.96 | 0.022 | 0.019 | 8.9 | 0.11 | 210 | 1.2 | 1.0 | 0.83 |
| 2 | 70 | 62 | 0.89 | 0.009 | 0.008 | 16.1 | 0.25 | −50 | 0.8 | 0.7 | 0.88 |
| 3 | 65 | 60 | 0.92 | 0.035 | 0.035 | 7.0 | 0.09 | 220 | 1.0 | 0.8 | 0.80 |
| 4 | 40 | 38 | 0.95 | 0.028 | 0.021 | 9.8 | 0.18 | 140 | 1.9 | 1.5 | 0.79 |
| 5 | 70 | 65 | 0.93 | 0.021 | 0.018 | 12.8 | 0.05 | 200 | 1.5 | 1.1 | 0.73 |
| 6 | 40 | 35 | 0.88 | 0.18 | 0.090 | 1.8 | 0.21 | 300 | 1.5 | 1.2 | 0.80 |
| 7 | | | | | | — | | | | | |
| 8 | 80 | 75 | 0.94 | 1.2 | 0.06 | 0.9 | 0.31 | −120 | 0.6 | 0.5 | 0.83 |
| 9 | 90 | 82 | 0.91 | 0.046 | 0.032 | 1.6 | 0.71 | 190 | 0.5 | 0.4 | 0.80 |
| 10 | 50 | 30 | 0.60 | 0.114 | 0.075 | 0.9 | 0.39 | −220 | 2.0 | 1.2 | 0.60 |

TABLE 4

| Sample No. | Cutting performance | | |
|---|---|---|---|
| | Wear width (mm) | Number of drilled holes (hole) | Cutting state |
| 1 | 0.156 | 3012 | Normal wear |
| 2 | 0.201 | 2977 | Normal wear |
| 3 | 0.142 | 3544 | Normal wear |
| 4 | 0.161 | 1980 | Normal wear |
| 5 | 0.163 | 3227 | Normal wear |
| 6 | 0.248 | 1453 | Chipping •Breakage |
| 7 | 0.297 | 899 | Peeling-off •Breakage |
| 8 | 0.422 | 911 | Abnormal wear |
| 9 | 0.184 | 1854 | Chip clogging |
| 10 | 0.222 | 1920 | Normal wear |

Tables 1 to 4 show the following results. In Sample No. 7 in which the diamond layer was composed of only one layer, the drill was fractured early because the cutting resistance increased and chipping occurred. In Sample No. 6 in which the first layer and the second layer of the diamond layer had the same hydrogen content ratio, the drill was also fractured early because the cutting resistance increased and chipping occurred. Sample No. 8 had poor wear resistance in which the mean particle size of the first diamond particles constituting the first coating layer was the same as the mean particle size of the second diamond particles constituting the second coating layer.

In contrast, in Samples Nos. 1 to 5, 9, and 10, each of which was within the scope of the present invention, the cutting edge had satisfactory wear resistance and the number of drilled holes was large because of less chipping. In particular, Samples Nos. 1 to 5 had a large number of drilled holes in which the mean particle size of the first diamond particles was 0.1-3 µm and the mean particle size of the second diamond particles was 0.001-0.25 µm. Samples Nos. 1 and 3 to 5 had a small wear width in which the thickness of the first coating layer was 5-15 µm and the thickness of the second coating layer was 0.5-3 µm. In Samples Nos. 1 to 5 and 10, in which the roughness of the interface between the first coating layer and the second coating layer was larger than the roughness of the surface of the second coating layer, the large number of drilled holes was obtained, and the residual stress in the intermediate thickness of the first coating layer was compressive stress. Samples Nos. 1, 3, and 5 had a large number of drilled holes in which the residual stress in the intermediate thickness of the second coating layer was extension stress. Samples Nos. 1 to 5, and 10 had satisfactory chip discharge performance in which e/i in Tables is less than 0.9 times and g/i was 0.9-1.1 times.

DESCRIPTION OF THE REFERENCE NUMERAL

1: drill
2: cutting edge
3: shank part
4: chip discharge groove
5: Base material
6: diamond layer
17: first coating layer
18: second coating layer
7: ridge line
8: rake surface
9: flank surface
10: side ridge line part
11: land part
15: cutting edge part
A: front end
B: rear end
O: rotation axis

The invention claimed is:

1. A coated tool comprising:
a base material;
a first layer located on the base material, containing diamond crystals with a first mean crystal size; and
a second layer is an outermost layer located on the first layer, containing diamond crystals with a second mean crystal size smaller than the first mean crystal size, and
wherein the first layer contains hydrogen with a first hydrogen content that is greater than zero, and the second layer contains hydrogen with a second hydrogen content larger than the first hydrogen content,
wherein residual stress in an intermediate position of a thickness of the first layer is compressive stress, and residual stress in an intermediate position of a thickness of the second layer is extension stress.

2. The coated tool according to claim 1, wherein the first mean crystals size is 0.1-3 µm, and the second mean crystals size is 0.001-0.25 µm.

3. The coated tool according to claim 1, wherein a thickness of the first layer is 5-15 µm, and a thickness of the second layer is 0.5-3 µm.

4. The coated tool according to claim 1, further comprising an interface located between the first layer and the second layer having roughness larger than roughness of a surface of the second layer.

5. The coated tool according to claim 1, wherein the base material comprises a hard alloy containing a hard phase and a binding phase and has a rod shape, and
the base material comprises at least a cutting edge located at a front end of the base material and a chip discharge groove being adjacent to the cutting edge and extending rearward from the front end.

6. The coated tool according to claim 5, wherein a content ratio of the binding phase in a surface part of the base material of the cutting edge is less than 0.9 times a content ratio of the binding phase in an interior of the base material, and
a content ratio of the binding phase in a surface part of the base material of the chip discharge groove is 0.9-1.1 times a content ratio of the binding phase in the interior of the base material.

7. The coated tool according to claim 1, wherein the first hydrogen content is 0.2-3.0% by atm.

8. The coated tool according to claim 1, wherein the second hydrogen content is 1-20% by atm.

9. The coated tool according to claim 7, wherein the second hydrogen content is 1-20% by atm.

* * * * *